United States Patent
Kim et al.

(10) Patent No.: US 8,908,448 B2
(45) Date of Patent: Dec. 9, 2014

(54) SEMICONDUCTOR MEMORY APPARATUS AND METHOD OF CONTROLLING EXTERNAL VOLTAGE USING THE SAME

(71) Applicant: SK Hynix Inc., Icheon-si Gyeonggi-do (KR)

(72) Inventors: Yeon Uk Kim, Icheon-si (KR); Jae Boum Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/018,732

(22) Filed: Sep. 5, 2013

(65) Prior Publication Data

US 2014/0321220 A1  Oct. 30, 2014

(30) Foreign Application Priority Data

Apr. 24, 2013  (KR) .......................... 10-2013-0045530

(51) Int. Cl.
*G11C 5/14* (2006.01)
*G11C 29/00* (2006.01)

(52) U.S. Cl.
CPC .................................... *G11C 29/787* (2013.01)
USPC ............ 365/189.09; 365/189.06; 365/189.11; 365/189.05

(58) Field of Classification Search
USPC ........................................ 365/180.09, 189, 6
See application file for complete search history.

(56) References Cited

U.S. PATENT DOCUMENTS

| | | | | |
|---|---|---|---|---|
| 6,087,891 A * | 7/2000 | Yoon et al. | .................... | 327/530 |
| 6,184,720 B1 * | 2/2001 | Kim et al. | ........................ | 327/37 |
| 6,545,527 B2 * | 4/2003 | Moreaux | ........................ | 327/525 |
| 7,075,359 B2 * | 7/2006 | Chen | .............................. | 327/541 |
| 7,091,768 B2 * | 8/2006 | Lee | ..................................... | 327/525 |
| 7,098,722 B2 * | 8/2006 | Shih et al. | ...................... | 327/525 |
| 7,129,772 B2 * | 10/2006 | Kim et al. | ...................... | 327/536 |
| 7,248,510 B2 * | 7/2007 | Choi et al. | .............. | 365/189.09 |
| 7,639,547 B2 * | 12/2009 | Moon et al. | ............. | 365/189.09 |
| 7,710,788 B2 * | 5/2010 | Jeon et al. | ................. | 365/185.33 |
| 7,808,841 B2 * | 10/2010 | Choi et al. | .............. | 365/189.05 |
| 8,358,555 B2 * | 1/2013 | Cha et al. | ................... | 365/225.7 |
| 8,598,943 B2 * | 12/2013 | Oh et al. | ....................... | 327/525 |

FOREIGN PATENT DOCUMENTS

KR   100780619 B1   11/2007
KR   1020100063294 A   6/2010

* cited by examiner

*Primary Examiner* — Huan Hoang
*Assistant Examiner* — Minh Dinh
(74) *Attorney, Agent, or Firm* — William Park & Associates Patent Ltd.

(57) ABSTRACT

A semiconductor memory apparatus according to the embodiment includes: an external connection terminal configured to supply an external voltage; a fuse unit configured to perform a fuse rupture operation; and an interruption circuit unit configured to respond to a test signal to determine whether the external connection terminal is connected to the fuse unit.

13 Claims, 3 Drawing Sheets

SEMICONDUCTOR MEMORY APPARATUS AND METHOD OF CONTROLLING EXTERNAL VOLTAGE USING THE SAME

CROSS-REFERENCES TO RELATED PATENT APPLICATION

The present application claims priority under 35 U.S.C. 119(a) to Korean Application No. 10-2013-0045530, filed on Apr. 24, 2013, in the Korean Intellectual Property Office, which is incorporated herein by reference in its entirety as set forth in full.

BACKGROUND

1. Technical Field

Various embodiments relate to a semiconductor apparatus, and more particularly, to a semiconductor memory apparatus and a voltage circuit for a method of controlling an external voltage using the same.

2. Related Art

A semiconductor memory apparatus is packaged to be released as a product. However, even though the packaged semiconductor memory apparatus has a minor defect of 1 bit, the packaged semiconductor memory apparatus may be regarded as a defective product, such that the packaged semiconductor memory apparatus may not be released as a product.

In order to repair the minor defect, the semiconductor memory apparatus includes a fuse to be repaired and then may be released as a product.

The defect repair operation of the semiconductor memory apparatus using the fuse applies a high voltage to the semiconductor memory apparatus from the outside to cut the fuse, thereby repairing the defective bit. The fuse cutting operation is referred to as a rupture operation.

Meanwhile, since the high voltage applied from the outside is continuously applied through an external connection terminal during the performance of the rupture operation and the performance of a test operation of the semiconductor memory apparatus, the semiconductor memory apparatus may be erroneously operated.

SUMMARY

In an embodiment of the present invention, a semiconductor memory apparatus includes: an external connection terminal configured to supply an external voltage; a fuse unit configured to perform a fuse rupture operation; and an interruption circuit unit configured to respond to a test signal to determine whether the external connection terminal is connected to the fuse unit.

In an embodiment of the present invention, a semiconductor memory apparatus includes: a fuse unit configured to perform a fuse rupture operation; and an interruption circuit unit configured to respond to a test signal to determine whether the fuse unit is applied with a first voltage.

In an embodiment of the present invention, a method of controlling an external voltage includes: determining whether a fuse rupture operation is performed; supplying the external voltage to a fuse unit when the fuse rupture operation is performed; and interrupting the supply of the external voltage by providing a voltage having a same level as the external voltage with pumping an internal voltage to an interruption circuit unit when a fuse rupture operation is not performed.

In an embodiment of the present invention, a semiconductor memory apparatus includes: an external connection terminal configured to supply a voltage that is higher than an internal voltage; and an interruption circuit unit applied with the internal voltage and configured to respond to a test signal to determine if the external connection terminal is connected to a fuse unit when the test signal is enabled or disabled.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in more detail with reference to the accompanying drawings.

Figure 1:
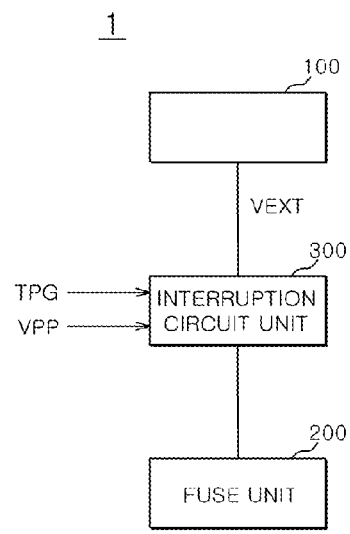
FIG. 1 is a schematic block diagram of a semiconductor memory apparatus in accordance with an embodiment of the present invention.

FIG. 1 is a schematic block diagram of a semiconductor memory apparatus 1 in accordance with an embodiment of the present invention.

Referring to FIG. 1, a semiconductor memory apparatus 1 may include an external connection terminal 100, a fuse unit 200, and an interruption circuit unit 300.

The external connection terminal 100 is a circuit which may electrically may the semiconductor memory apparatus 1 to the outside. The external connection terminal 100 may supply an external voltage VEXT to the semiconductor memory apparatus 1.

The fuse unit 200 may respond to the external voltage VEXT output from the external connection terminal 100 to perform a rupture operation. The fuse unit 200 may be a fuse set array including a plurality of fuses.

In general, the fuse used in the semiconductor memory apparatus 1 may be formed as a transistor type fuse and a fuse rupture operation means an operation of rupturing an insulating film of a fuse gate. In this case, the gate insulating film may be formed of a silicon oxide film. In addition, when the silicon oxide film may be applied with a high voltage, the silicon oxide film may have micro cracks due to a voltage difference from a bulk terminal and may be in a state in which a current may flow.

Therefore, the external voltage VEXT supplied from the external connection terminal 100 may be a high voltage enough to cause cracks on the fuse gate insulating film and have a voltage level higher than that of an internal voltage VPP.

The interruption circuit unit 300 may be connected between the external connection terminal 100 and the fuse unit 200. The interruption circuit unit 300 is applied with the internal voltage VPP and responds to a test signal TPG to determine whether the external connection terminal 100 is connected to the fuse unit 200.

In this case, when the semiconductor memory apparatus 1 performs the fuse rupture operation, the test signal TPG may be enabled and when the semiconductor memory apparatus 1 does not perform the fuse rupture operation, the test signal TPG may be disabled.

The operation of the semiconductor memory apparatus 1 will be described below with reference to FIG. 1.

When the test signal TPG is enabled, the interruption circuit unit 300 may connect the external connection terminal 100 to the fuse unit 200 to supply the external voltage VEXT to the fuse unit 200.

Next, when the test signal TPG is disabled, the interruption circuit unit 300 may disconnect the external connection terminal 100 from the fuse unit 200. When the test signal TPG is disabled, the interruption circuit unit 300 may pump the internal voltage VPP to rise up to the same level as the external voltage VEXT, thereby interrupting the external voltage VEXT output from the external connection terminal 100 from being supplied to the fuse unit 200.

Figure 2:
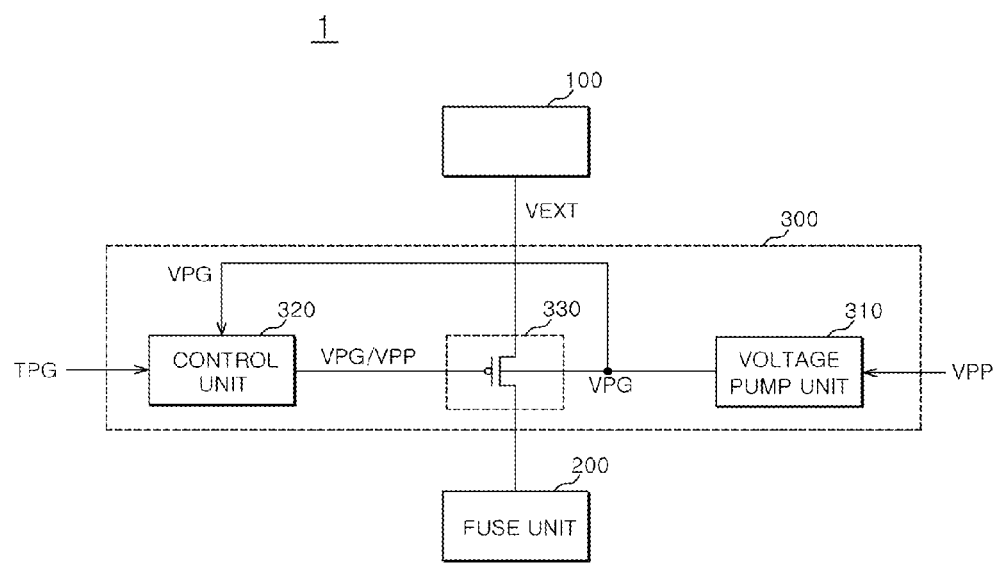
FIG. 2 is a detailed block diagram of the semiconductor memory apparatus in accordance with an embodiment of the present invention.

FIG. 2 is a detailed block diagram of the semiconductor memory apparatus 1 in accordance with an embodiment of the present invention.

Referring to FIG. 2, the semiconductor memory apparatus 1 may include the external connection terminal 100, the fuse unit 200, and the interruption circuit unit 300.

The interruption circuit unit 300 may include a voltage pump unit 310, a control unit 320, and a switch unit 330.

The external connection terminal 100 is a circuit which electrically connects the semiconductor memory apparatus 1 to the outside. The external connection terminal 100 may supply the external voltage VEXT to the semiconductor memory apparatus 1.

The fuse unit 200 may respond to the external voltage VEXT output from the external connection terminal 100 to perform the fuse rupture operation.

The voltage pump unit 310 may pump the internal voltage VPP to generate the pumping voltage VPG having the level of the external voltage VEXT. Here, the voltage pump unit 310 may be a known charge pumping circuit.

The control unit 320 may be applied with the pumping voltage VPG and respond to the test signal TPG to output the pumping voltage VPG or change the voltage level of the pumping voltage VPG to output the internal voltage VPP.

Here, the control unit 320 may be a known voltage level shifter.

When the enabled test signal TPG is input, the control unit 320 may output the internal voltage VPP changing the voltage level of the pumping voltage VPG. To the contrary, when the disabled test signal TPG is input, the control unit 320 may output the pumping voltage VPG.

The switch unit 330 may be connected between the external connection terminal 100 and the fuse unit 200 and respond to the pumping voltage VPG and the output voltage of the control unit 320 to determine whether the external connection terminal 100 is electrically connected to the fuse unit 200.

The switch unit 330 may be connected between the external connection terminal 100 and the fuse unit 200 and may be a PMOS transistor of which the bulk terminal is applied with the pumping voltage VPG and the gate terminal may be applied with the output voltage of the control unit 320.

When the switch unit 330 is applied with the internal voltage VPP, the switch unit 330 may connect the external connection terminal 100 to the fuse unit 200 to supply the external voltage VEXT to the fuse unit 200.

When the switch unit 330 is applied with the pumping voltage VPG, the switch unit 330 may disconnect the external connection terminal 100 from the fuse unit 200.

In detail, when the PMOS transistor is applied with the internal voltage VPP, the PMOS transistor is turned on to connect between a source and a drain thereof. That is, when the PMOS transistor is applied with the pumping voltage VPG or the internal voltage VPP having a voltage level lower than that of the external voltage VEXT, the PMOS transistor may be turned on to supply the external voltage VEXT to the fuse unit 200.

To the contrary, when the PMOS transistor is applied with the pumping voltage VPG, the PMOS transistor may be turned off. That is, when the PMOS transistor is applied with the pumping voltage VPG, the gate terminal, the source terminal, and the bulk terminal of the PMOS transistor have the same voltage level. In this case, the pumping voltage VPG may not be beyond a threshold voltage of the PMOS transistor, such that the PMOS transistor is turned off. Therefore, when the PMOS transistor is applied with the pumping voltage VPG, the PMOS transistor may be turned off to interrupt the supply of the external voltage VEXT to the fuse unit 200.

Only when the semiconductor memory apparatus 1 in accordance with an embodiment of the present invention performs the fuse rupture operation, the external voltage VEXT inputted from the external connection terminal 100 may be applied to the inside of the semiconductor memory apparatus 1. To the contrary, when the semiconductor memory apparatus 1 does not perform the fuse rupture operation, the external voltage VEXT having a high voltage level inputted from the external connection terminal 100 may be interrupted so as not to be applied to the inside of the semiconductor memory apparatus 1.

Figure 3:
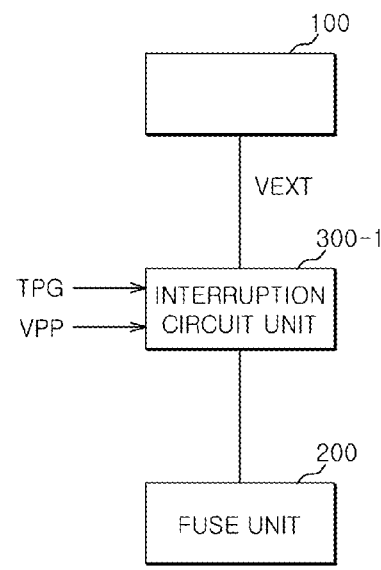
FIG. 3 is a schematic block diagram of a semiconductor memory apparatus in accordance with an embodiment of the present invention.

FIG. 3 is a semiconductor memory apparatus 2 in accordance with an embodiment of the present invention.

Referring to FIG. 3, a semiconductor memory apparatus 2 includes the external connection terminal 100, the fuse unit 200, and an interruption circuit unit 300-1.

The external connection terminal 100 is a circuit which may electrically connect the semiconductor memory apparatus 2 to the outside. The external connection terminal 100 may supply the external voltage VEXT to the semiconductor memory apparatus 2.

The fuse unit 200 may respond to the external voltage VEXT output from the external connection terminal 100 to perform the rupture operation. The fuse unit 200 may be the fuse set array including a plurality of fuses.

In general, the fuse used in the semiconductor memory apparatus 2 may be formed as the transistor type fuse and the fuse rupture operation means the operation of rupturing the insulating film of the fuse gate. In this case, the gate insulating film may be formed of the silicon oxide film. Further, when the silicon oxide film is applied with a high voltage, the silicon oxide film may have micro cracks due to the voltage difference from the bulk terminal and be in a state in which a current may flow.

Therefore, the external voltage VEXT supplied from the external connection terminal 100 may be a high voltage enough to generate cracks on the fuse gate insulating film and has a voltage level higher than that of the internal voltage VPP.

The interruption circuit unit 300-1 may be connected between the external connection terminal 100 and the fuse unit 200. The interruption circuit unit 300 may be applied with the internal voltage VPP and respond to the test signal TPG to determine whether the external connection terminal 100 is connected to the fuse unit 200.

In this case, when the semiconductor memory apparatus 2 performs the fuse rupture operation, the test signal TPG may be enabled and when the semiconductor memory apparatus 2 does not perform the fuse rupture operation, the test signal TPG may be disabled.

Figure 4:
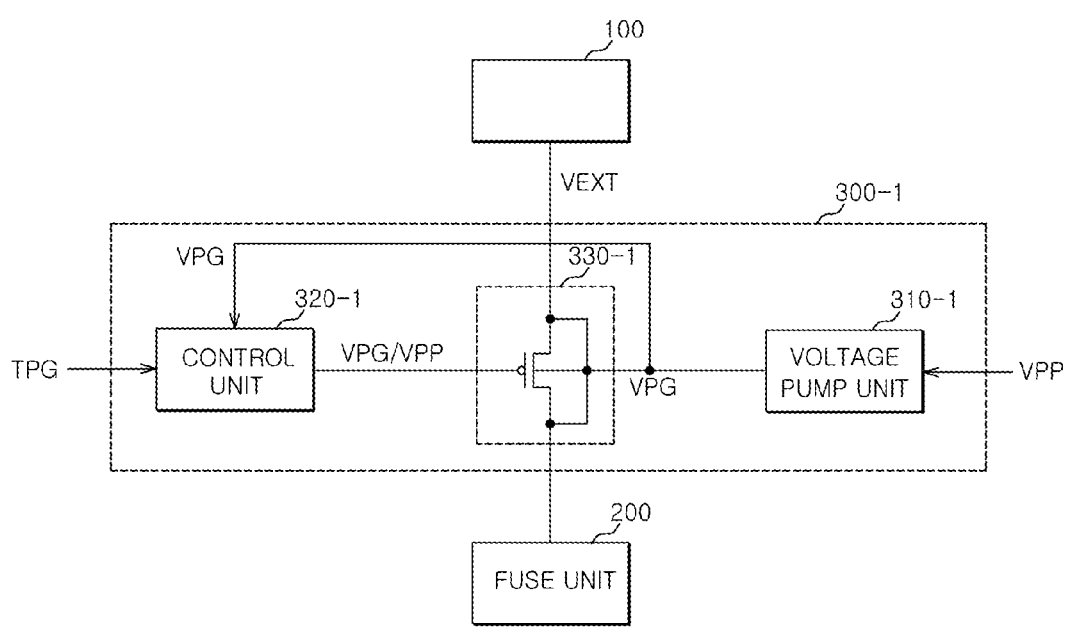
FIG. 4 is a detailed block diagram of the semiconductor memory apparatus in accordance with an embodiment of the present invention.

FIG. 4 is a detailed block diagram of the semiconductor memory apparatus 2 in accordance with an embodiment of the present invention.

Referring to FIG. 4, the semiconductor memory apparatus 2 may include the external connection terminal 100, the fuse unit 200, and the interruption circuit unit 300-1.

The interruption circuit unit 300-1 may include a voltage pump unit 310-1, a control unit 320-1, and a switch unit 330-1.

The external connection terminal 100 may be a circuit which electrically connects the semiconductor memory apparatus 2 to the outside. The external connection terminal 100 may supply the external voltage VEXT to the semiconductor memory apparatus 2.

The fuse unit 200 may respond to the external voltage VEXT output from the external connection terminal 100 to perform the fuse rupture operation.

The voltage pump unit 310-1 may pump the internal voltage VPP to generate the pumping voltage VPG having the level of the external voltage VEXT. Here, the voltage pump unit 310-1 may be the known charge pumping circuit.

The control unit 320-1 may be applied with the pumping voltage VPG and respond to the test signal TPG to output the pumping voltage VPG or change the voltage level of the pumping voltage VPG to output the internal voltage VPP.

Here, the control unit 320 may be the known voltage level shifter.

When the enabled test signal TPG is input, the control unit 320-1 may output the internal voltage VPP changing the voltage level of the pumping voltage VPG. To the contrary, when the disabled test signal TPG is input, the control unit 320-1 may output the pumping voltage VPG.

The switch unit 330-1 may be connected between the external connection terminal 100 and the fuse unit 200 and respond to the pumping voltage VPG and the output voltage of the control unit 320 to determine whether the external connection terminal 100 is electrically connected to the fuse unit 200.

The switch unit 330-1 may be connected between the external connection terminal 100 and the fuse unit 200 and may be the PMOS transistor of which the bulk terminal, the drain terminal, and the source terminal are applied with the pumping voltage VPG and the gate terminal is applied with the output voltage of the control unit 320-1.

When the switch unit 330-1 is applied with the internal voltage VPP, the switch unit 330-1 may connect the external connection terminal 100 to the fuse unit 200 to supply the external voltage VEXT to the fuse unit 200.

When the switch unit 330-1 is applied with the pumping voltage VPG, the switch unit 330-1 may disconnect the external connection terminal 100 from the fuse unit 200.

In detail, when the PMOS transistor is applied with the internal voltage VPP, the PMOS transistor may be turned on to connect between the source and the drain thereof. That is, when the PMOS transistor is applied with the pumping voltage VPG or the internal voltage VPP having a voltage level lower than that of the external voltage VEXT, the PMOS transistor may be turned on to supply the external voltage VEXT to the fuse unit 200.

To the contrary, when the PMOS transistor is applied with the pumping voltage VPG, the PMOS transistor may be turned off. That is, when the PMOS transistor is applied with the pumping voltage VPG, the gate terminal, the source terminal, the drain terminal, and the bulk terminal of the PMOS transistor may have the same voltage level. In this case, the pumping voltage VPG may not be beyond a threshold voltage of the PMOS transistor, such that the PMOS transistor is turned off. Therefore, when the PMOS transistor is applied with the pumping voltage VPG, the PMOS transistor may be turned off to interrupt the supply of the external voltage VEXT to the fuse unit 200.

Figure 5:
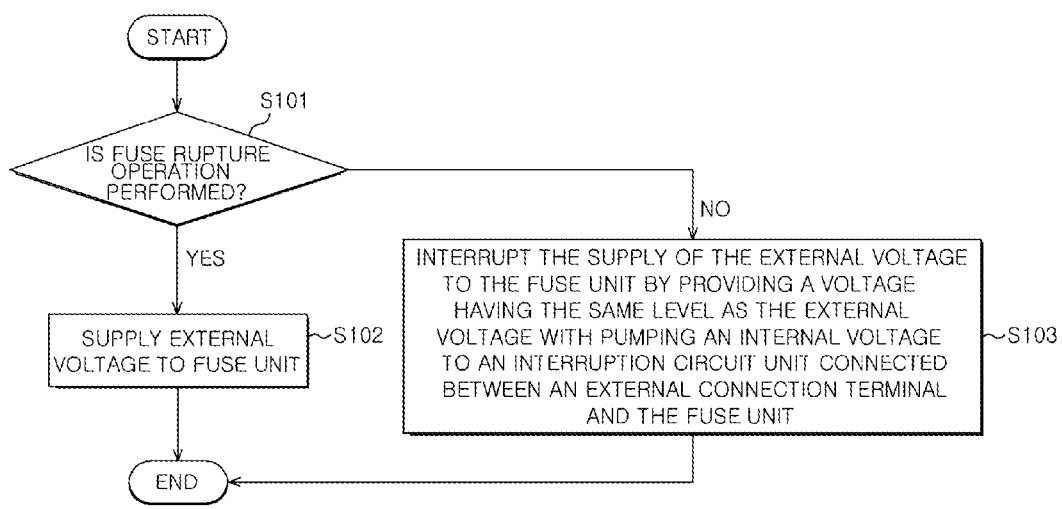
FIG. 5 is a flow chart describing a method of controlling an external voltage of a semiconductor memory apparatus in accordance with an embodiment of the present invention.

FIG. 5 is a flow chart describing a method of controlling an external voltage of a semiconductor memory apparatus in accordance with an embodiment of the present invention.

It is determined whether the fuse rupture operation is performed (S101). When the fuse rupture operation is performed (S101, YES), the external voltage VEXT may be supplied to the fuse unit 200 (S102).

When the fuse rupture operation is not performed (S101, NO), the internal voltage VPP may be pumped to supply a voltage having the same level as the external voltage VEXT to the interruption circuit units 300 and 300-1 connected between the external connection terminal 100 and the fuse unit 200 so as to interrupt the supply of the external voltage VEXT to the fuse unit 200 (S103).

Those skilled in the art will appreciate that since various modifications and alterations may be made without departing from the spirit or essential feature of the present invention, the above-mentioned embodiments are not restrictive but are exemplary in all aspects. It should be interpreted that the scope of the present invention is defined by the following claims rather than the above-mentioned detailed description and all modifications or alterations deduced from the meaning, the scope, and equivalences of the claims are included in the scope of the present invention.

What is claimed is:

1. A semiconductor memory apparatus, comprising:
   an external connection terminal configured to supply an external voltage;
   a fuse unit configured to perform a fuse rupture operation; and
   an interruption circuit unit configured—to—respond to a test signal to determine whether the external connection terminal is connected to the fuse unit,
   wherein the interruption circuit unit includes:
   a voltage pump unit configured to pump an internal voltage to generate a pumping voltage;
   a control unit configured to be applied with the pumping voltage and respond to the test signal to output the pumping voltage or the internal voltage; and
   a switch unit configured to respond to the pumping voltage or the internal voltage to determine whether the external connection terminal is connected to the fuse unit.

2. The semiconductor memory apparatus of claim 1, wherein the pumping voltage has the same voltage level as the external voltage and has a voltage level higher than that of the internal voltage.

3. The semiconductor memory apparatus of claim 2, wherein the control unit outputs the pumping voltage when the test signal is disabled and changes a level of the pumping voltage when the test signal is enabled to output the internal voltage.

4. The semiconductor memory apparatus of claim 3, wherein the switch unit connects the external connection terminal to the fuse unit when the internal voltage is input and disconnects the external connection terminal from the fuse unit when the pumping voltage is input.

5. The semiconductor memory apparatus of claim 4, wherein the test signal is enabled at the performance of the fuse rupture operation.

6. The semiconductor memory apparatus of claim 4, wherein the switch unit is a PMOS transistor.

7. The semiconductor memory apparatus of claim 6, wherein the PMOS transistor is connected between the external connection terminal and the fuse unit and has a bulk terminal applied with the pumping voltage and a gate terminal applied with an output voltage of the control unit.

8. The semiconductor memory apparatus of claim 6, wherein the PMOS transistor is connected between the external connection terminal and the fuse unit and has a bulk terminal, a drain terminal, and a source terminal applied with the pumping voltage and a gate terminal applied with an output voltage of the control unit.

9. A semiconductor memory apparatus, comprising:
a fuse unit configured to perform a fuse rupture operation; and
an interruption circuit unit configured to respond to a test signal to determine whether the fuse unit is applied with a first voltage,
wherein the interruption circuit unit includes:
a voltage pump unit configured to pump the second voltage to generate a pumping voltage having the same voltage level as the first voltage;
a control unit configured to be applied with the pumping voltage and respond to the test signal to output the pumping voltage or the internal voltage; and
a switch unit configured to respond to the pumping voltage or the second voltage to determine whether the fuse unit is applied with the first voltage.

10. The semiconductor memory apparatus of claim 9, wherein the first voltage has a level higher than that of a second voltage.

11. The semiconductor memory apparatus of claim 10, wherein the control unit outputs the pumping voltage when the test signal is disabled and changes a level of the pumping voltage when the test signal is enabled to output the second voltage.

12. The semiconductor memory apparatus of claim 11, wherein the switch unit supplies the first voltage to the fuse unit when the second voltage is input and interrupts the first voltage from being supplied to the fuse unit when the pumping voltage is input.

13. The semiconductor memory apparatus of claim 11, wherein the test signal is enabled at the performance of the fuse rupture operation.

* * * * *